United States Patent
Kim et al.

(10) Patent No.: US 7,463,509 B2
(45) Date of Patent: Dec. 9, 2008

(54) MAGNETO-RESISTIVE RAM HAVING MULTI-BIT CELL ARRAY STRUCTURE

(75) Inventors: Hye-Jin Kim, Seoul (KR); Woo-Yeong Cho, Hwaseong-si (KR); Hyung-Rok Oh, Seongnam-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 11/260,602

(22) Filed: Oct. 27, 2005

(65) Prior Publication Data
US 2006/0092690 A1 May 4, 2006

(30) Foreign Application Priority Data
Oct. 28, 2004 (KR) .................. 10-2004-0086556

(51) Int. Cl.
*G11C 11/00* (2006.01)
(52) U.S. Cl. .................. 365/158; 365/173
(58) Field of Classification Search .................. 365/158, 365/173
See application file for complete search history.

(56) References Cited

U.S. PATENT DOCUMENTS

| | | | | |
|---|---|---|---|---|
| 5,748,519 A | * | 5/1998 | Tehrani et al. | 365/98 |
| 6,795,334 B2 | * | 9/2004 | Iwata et al. | 365/158 |
| 6,826,076 B2 | * | 11/2004 | Asano et al. | 365/158 |
| 2002/0140060 A1 | | 10/2002 | Asao et al. | |
| 2003/0123271 A1 | | 7/2003 | Iwata | |
| 2005/0052905 A1 | * | 3/2005 | Tran et al. | 365/173 |
| 2005/0073878 A1 | * | 4/2005 | Lin et al. | 365/158 |
| 2005/0195673 A1 | * | 9/2005 | Asao et al. | 365/222 |

FOREIGN PATENT DOCUMENTS

| | | |
|---|---|---|
| EP | 1 398 835 A1 | 10/2007 |
| JP | 2001-217398 | 8/2001 |
| JP | 2001217398 | 8/2001 |
| JP | 2001236781 | 8/2001 |
| JP | 2003133528 | 5/2003 |
| JP | 20030055390 | 7/2003 |
| JP | 2004-31640 | 1/2004 |

* cited by examiner

*Primary Examiner*—Hoai V Ho
(74) *Attorney, Agent, or Firm*—F. Chau & Associates, LLC

(57) ABSTRACT

A magnetic random access memory (RAM) with a multi-bit cell array structure includes an access transistor formed on a substrate, first through third resistance-variable elements, and first through third current supplying lines. The first through third resistance-variable elements are disposed between a bit line and the access transistor, and electrically connected to each other. The first through third current supplying lines are stacked alternately with the first through third resistance-variable elements. The first through third resistance-variable elements have equal resistances.

24 Claims, 10 Drawing Sheets

| MTJ1 | MTJ2 | MTJ3 | READ | |
|---|---|---|---|---|
| 0 | 0 | 0 | → 3R | (00) |
| 0 | 0 | 0 | | |
| 0 | 1 | 0 | → 3R+ΔR | (01) |
| 1 | 0 | 0 | | |
| 0 | 1 | 1 | | |
| 1 | 0 | 1 | → 3R+Δ2R | (10) |
| 1 | 1 | 0 | | |
| 1 | 1 | 1 | → 3R+Δ3R | (11) |

FIG. 5

| WRITE | | MTJ1 | MTJ2 | MTJ3 | READ | |
|---|---|---|---|---|---|---|
| CSL1 | CSL3 | | | | | |
| ⊗ | ⊗ | 0 | 0 | 0 | 3R | (00) |
| ⊗ | ⊙ | 0 | 0 | 1 | 3R+ΔR | (01) |
| ⊙ | ⊗ | 1 | 1 | 0 | 3R+Δ2R | (10) |
| ⊙ | ⊙ | 1 | 1 | 1 | 3R+Δ3R | (11) |

CSL1 (SAME DATA ARE WRITTEN) → MTJ1, MTJ2
CSL3 → MTJ3

FIG. 6B

| WRITE | | BL | CSL2 (SAME DATA ARE WRITTEN) | | READ |
|---|---|---|---|---|---|
| BL | CSL2 | MTJ1 | MTJ2 | MTJ3 | |
| → | → | 0 | 0 | 0 | 3R (00) |
| ← | → | 1 | 0 | 0 | 3R+ΔR (01) |
| → | ← | 0 | 1 | 1 | 3R+Δ2R (10) |
| ← | ← | 1 | 1 | 1 | 3R+Δ3R (11) |

FIG. 8B

| MTJ1 | MTJ2 | READ | |
|---|---|---|---|
| 0 | 0 | R1+R2 | (00) |
| 1 | 0 | R1+R2+$\Delta$R1 | (01) |
| 0 | 1 | R1+R2+$\Delta$R2 | (10) |
| 1 | 1 | R1+$\Delta$R1+R2+$\Delta$R2 | (11) |

FIG. 9

| WRITE | | MTJ1 | MTJ2 | READ |
|---|---|---|---|---|
| BL | CSL2 | | | |
| → | → | 0 | 0 | 00 |
| → | ← | 0 | 1 | 01 |
| ← | → | 1 | 0 | 10 |
| ← | ← | 1 | 1 | 11 |

| WRITE | | MTJ1 | MTJ2 | READ |
|---|---|---|---|---|
| BL | CSL2 | | | |
| → | ← | 0 | 0 | 00 |
| → | → | 0 | 1 | 01 |
| ← | ← | 1 | 0 | 10 |
| ← | → | 1 | 1 | 11 |

MAGNETO-RESISTIVE RAM HAVING MULTI-BIT CELL ARRAY STRUCTURE

BACKGROUND OF THE INVENTION

This application claims the priority of Korean Patent Application No. 10-2004-0086556, filed on Oct. 28, 2004, in the Korean Intellectual Property Office, the disclosure of which is incorporated herein in its entirety by reference.

1. Field of the Invention

The present invention relates to a magneto-resistive RAM, and more particularly, to a magneto-resistive RAM having a multi-bit cell array structure.

2. Description of Related Art

A magnetic RAM (Random Access Memory) device implements a plurality of resistance-variable components connected to a transistor. Such a magnetic RAM is a memory device, which writes information by changing the directions of magnetization of the respective ferromagnetic thin films and reads information by sensing a change in current caused by the change in the directions of the respective ferromagnetic thin films. Magnetic RAM is a non-volatile and can achieve high-speed operation, low power consumption, and high-integrity due to the intrinsic characteristics of the ferromagnetic thin films.

In a magnetic RAM, a memory device is implemented using a giant magneto-resistive (GMR) effect or a tunneling magneto-resistive (TMR) effect.

A magnetic RAM using the GMR effect uses the fact that resistance varies according to whether two magnetic layers having a nonmagnetic layer there between are magnetized in the same direction or in opposite directions. A magnetic RAM using a spin polarization magnetic permeability effect uses the fact that the permeability of electrons through an insulation layer interposed between two magnetic layers is greater when the magnetic layers are magnetized in the same direction than in opposite directions. FIG. 1 shows the structure of a general magnetic RAM.

FIG. 1 shows a magnetic RAM 100 using the spin polarization magnetic permeability effect. Referring to FIG. 1, the magnetic RAM 100 includes an access transistor TR controlled by a control signal from a word line WL, and a magnetic tunnel junction (MTJ) for storing data that is electrically connected to the access transistor TR. The magnetic RAM 100 further includes a digit line DL, and a bit line BL connected to the MTJ. The MTJ includes a pinned ferromagnetic layer 30, a tunnel barrier layer 20, and a free ferromagnetic layer 10.

The magnetization direction of the free ferromagnetic layer 10 can be changed by a current flowing perpendicular to the longitudinal axis of the MTJ. Accordingly, since the digit line DL is aligned perpendicular to the longitudinal axis of the MTJ, a current flowing through the digit line DL can control the magnetization direction of the free ferromagnetic layer 10. In addition, if the bit line BL is aligned perpendicular to the longitudinal axis of the MTJ, a current flowing through the bit line BL can control the magnetization direction of the free ferromagnetic layer 10. The bit line BL is to both read and write data, while the digit line DL is used to write data. The digit line DL is aligned parallel to the word line WL.

When the magnetic RAM 100 operates, a sensing current flows through the tunnel barrier layer 20 in a direction perpendicular to the longitudinal axis of the MTJ. A magnetization direction of the pinned ferromagnetic layer 30 and the free ferromagnetic layer 10 may be the same direction or an opposite direction according to a magnetization direction of the free ferromagnetic layer 10. The magnetization directions of the free ferromagnetic layer 10 and the pinned ferromagnetic layer 30 affect the sensing current.

If the magnetization direction of the free ferromagnetic layer 10 is opposite to that of the pinned ferromagnetic layer 30, the resistance of the MTJ increases, which reduces the sensing current. If the magnetization direction of the free ferromagnetic layer 10 is the same as that of the pinned ferromagnetic layer 30, the resistance of the MTJ decreases, which increases the sensing current. Data stored in the magnetic RAM 100 is determined by the resistance. To write data in the magnetic RAM 100, the access transistor TR is turned off in response to a signal transferred through the word line WL, thus inducing a current through the digit line DL. If a current flows through the bit line BL, a magnetization direction of the free ferromagnetic layer 10 of the MTJ is determined by a vector sum of the magnetic fields formed by the currents through the digit line DL and the bit line BL.

To read data in the magnetic RAM 100, the access transistor TR is turned on in response to a signal transferred through the word line WL, thus forming a current path to ground. If the magnetization direction of the free ferromagnetic layer 10 is equal to that of the pinned ferromagnetic layer 30, and accordingly the MTJ has relatively small resistance, a constant current supplied to the bit line BL produces a correspondingly low voltage across the MTJ.

If the magnetization direction of the free ferromagnetic layer 10 is opposite to that of the pinned ferromagnetic layer 30, and accordingly the MTJ has a relatively large resistance, a constant current supplied to the bit line BL produces a correspondingly high voltage across the MTJ. Therefore, by measuring the voltage across the MTJ, data stored in the magnetic RAM 100 can be read.

FIG. 2 shows the structure of a conventional multi-bit magnetic RAM disclosed in U.S. Pat. No. 5,930,164. The magnetic RAM 200 has a stacked structure including two MTJs 11 and 12 electrically connected to each other through a conductive layer 13. The two MTJs 11 and 12 have different resistances and hysteresis characteristics.

By differentiating the thickness of a tunnel barrier layer 113 of the MTJ 11 from that of a tunnel barrier layer 123 of the MTJ 12, the two MTJs 11 and 12 can have different resistances. Also, by differentiating the thickness of a free ferromagnetic layer 112 of the MTJ 11 from that of a free ferromagnetic layer 122 of the MTJ 12, the two MTJs 11 and 12 can be switched by different magnetic fields. When data is read, the fact that the resistances of the two MTJ 11 and 12 are different from each other is used.

It is assumed that the minimum resistance and a maximum resistance of the MTJ 11 are min(R1) and max(R1+ΔR1), respectively, and that the minimum resistance and the maximum resistance of the MTJ 12 are min(R2) and max(R2+ΔR2), respectively. When data written to the MTJs 11 and 12 is 00 (written as (MTJ 11, MTJ 12)=00), the total resistance of the MTJs 11 and 12 is R1+R2. When (MTJ 11, MTJ 12)=10, the total resistance of the MTJs 11 and 12 is R1+R2+ΔR1. When (MTJ 11, MTJ 12)=01, the total resistance value of the MTJs 11 and 12 is R1+R2+ΔR2. When (MTJ 11, MTJ 12)=11, the total resistance of the MTJs 11 and 12 is R1+R2+ΔR1+ΔR2

Accordingly, when data is read, since different voltages are detected at the bit line BL due to the different resistances of the MTJs 11 and 12 corresponding to written data when a predetermined current is applied to the magnetic RAM 200, 2-bit data written to the two MTJs 11 and 12 can be sensed according to the detected voltages.

When data is written, the fact that the hysteresis characteristics of the two MTJs 11 and 12 are different from each other is used. Since the MTJs 11 and 12 are switched by different magnetic fields, due to their different hysteresis characteristics, by adjusting the current flowing through a digit line (not shown), it is possible to write desired multi-bit data in a cell.

To write data '00' or '11', that is, to set (MTJ 11, MTJ 12)=00 or (MTJ 11, MTJ 12)=11, a magnetic field needs to be greatly increased or decreased. To write data '01' or '10', that is, to set (MTJ 11, MTJ 12)=01 or(MTJ 11, MTJ 12)=10, two write operations are needed. For example, to write data '01' ((MTJ 11, MTJ 12)=01), a magnetic field for writing data '00' ((MTJ 11, MTJ 12)=00) is applied to a cell followed by a magnetic field for writing data '01' ((MTJ 11, MTJ 12)=01).

To write data '10', that is, to set (MTJ 11, MTJ 12)=10, a magnetic field for writing data '11' ((MTJ 11, MTJ 12)=11) is applied to a cell followed by a magnetic field for writing data '10' ((MTJ 11, MTJ 12)=10).

Accordingly, to write data in the magnetic RAM 200 with the cell array structure as shown in FIG. 2, both the direction and magnitude of the magnetic field needs to be adjusted. Also, to write data "01" or "10" a multi-step write process is needed.

Furthermore, during a write operation, it is difficult to accurately apply a desired amount of magnetic field by adjusting the magnitude and direction of the current.

SUMMARY OF THE INVENTION

According to an embodiment of the present invention, a magnetic RAM includes an access transistor formed on a substrate, first through third resistance-variable elements, and first through third current supplying lines.

The first through third resistance-variable elements are stacked between the access transistor and a bit line, and the first through third resistance-variable elements are electrically connected to each other.

The first through third resistance-variable elements have equal resistance characteristics. Each of the first through third resistance-variable elements includes a pinned ferromagnetic layer. Magnetization directions of the pinned ferromagnetic layers of two of the first through third resistance-variable elements sharing one of the first through third current supplying lines, through which a bi-directional current flow, are opposite to each other.

The same data is written to the two resistance-variable elements sharing one of the first through third current supplying lines, through which a bi-directional current flow.

In the magnetic RAM, a predetermined conductive layer passes through the first through third current supplying lines. The bit line and the second current supplying line are orthogonal to the first and third current supplying lines.

The longitudinal axes of the first through third resistance-variable elements are aligned in parallel with the bit line and the second current supplying line, and data are written to the first through third resistance-variable elements in response to bi-directional currents flowing through the first through third current supplying lines.

The longitudinal axes of the first through third resistance-variable elements are perpendicular to the bit line and the second current supplying line, and data are written to the first through third resistance-variable elements in response to bi-directional currents flowing through the bit line and the second current supplying line. The first and third resistance-variable elements are made of magneto-resistive material.

According to an embodiment of the present invention, a magnetic RAM includes an access transistor formed on a substrate, first and second resistance-variable elements, and current supplying lines.

The first and second resistance-variable elements are formed on the access transistor, and the first and second resistance-variable elements are electrically connected to each other. A bit line is formed on the second resistance-variable element. The current supplying lines are respectively disposed between neighboring two of the access transistor and the first and second resistance-variable elements. The first resistance-variable element has different resistance characteristics from the second resistance-variable element.

According to an embodiment of the present invention, a magnetic RAM capable of simultaneously writing or reading n-bit data, includes an access transistor formed on a substrate, first through $(2^n-1)$-th resistance-variable elements, and first through $(2^n-1)$-th current supplying lines.

The first through $(2^n-1)$-th resistance-variable elements are stacked between the access transistor and a bit line, and the first through $(2^n-1)$-th resistance-variable elements are electrically connected to each other.

The first through $(2^n-1)$-th current supplying lines are stacked alternately with the first through $(2^n-1)$-th resistance-variable elements.

According to an embodiment of the present invention, a magnetic RAM capable of simultaneously writing or reading multi-bit data, includes an access transistor formed on a substrate, bit lines and digit lines alternately applied on the access transistor, and a plurality of resistance-variable elements disposed between the bit lines and the digit lines, electrically connected to each other.

BRIEF DESCRIPTION OF THE DRAWINGS

The present invention will become more apparent by describing in detail exemplary embodiments thereof with reference to the attached drawings in which:

FIG. 5 is a table for explaining data written to the magnetic RAM of FIG. 3A;

FIG. 6B is a table for explaining data written to the magnetic RAM shown in FIG. 6A;

FIG. 8B is a table for explaining the states of data written to the magnetic RAM of FIG. 7;

FIG. 9 is a table for explaining data written to the magnetic RAM of FIG. 7;

DETAILED DESCRIPTION OF PREFERRED EMBODIMENTS

Hereinafter, embodiments of the present invention will be described in detail with reference to the appended drawings. Like reference numbers refer to like components throughout the drawings.

Figure 1:
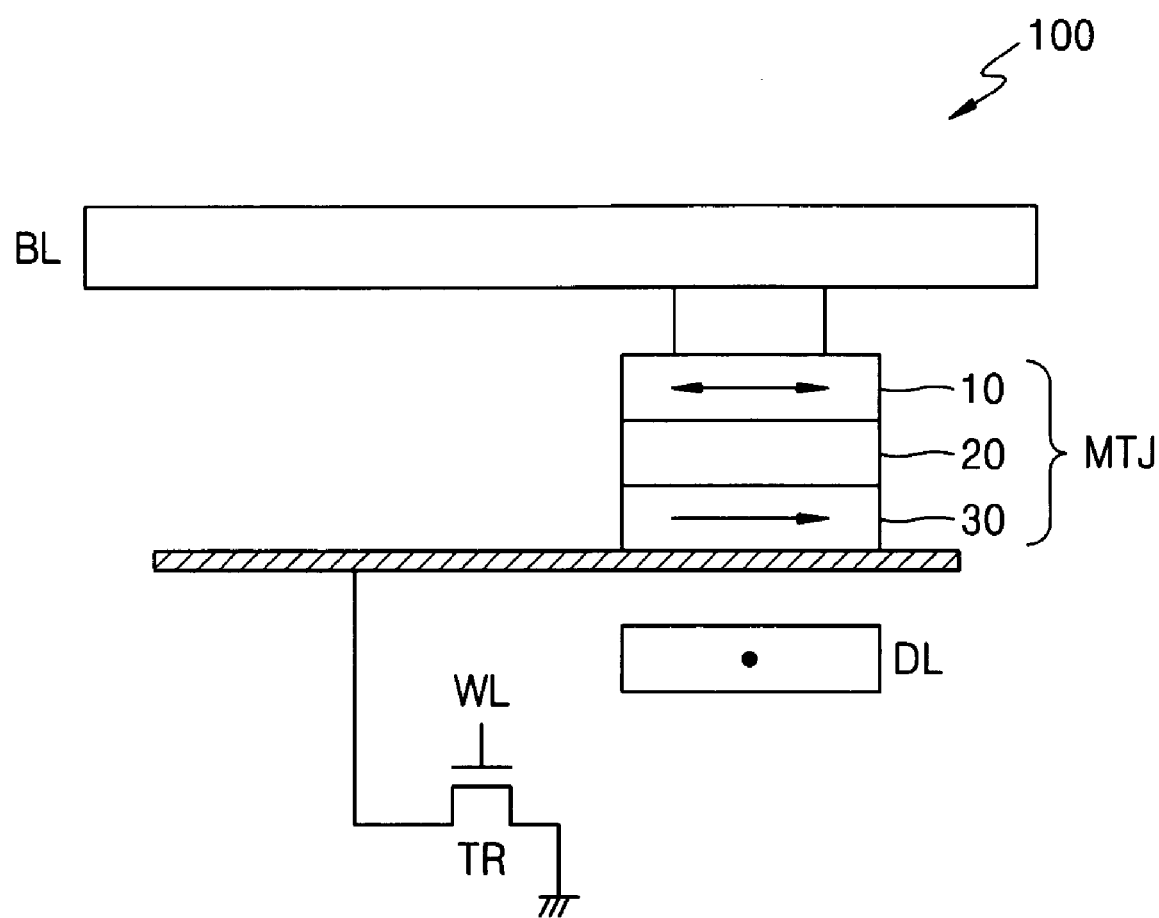
FIG. 1 is a schematic diagram of a general magnetic RAM.
Figure 2:
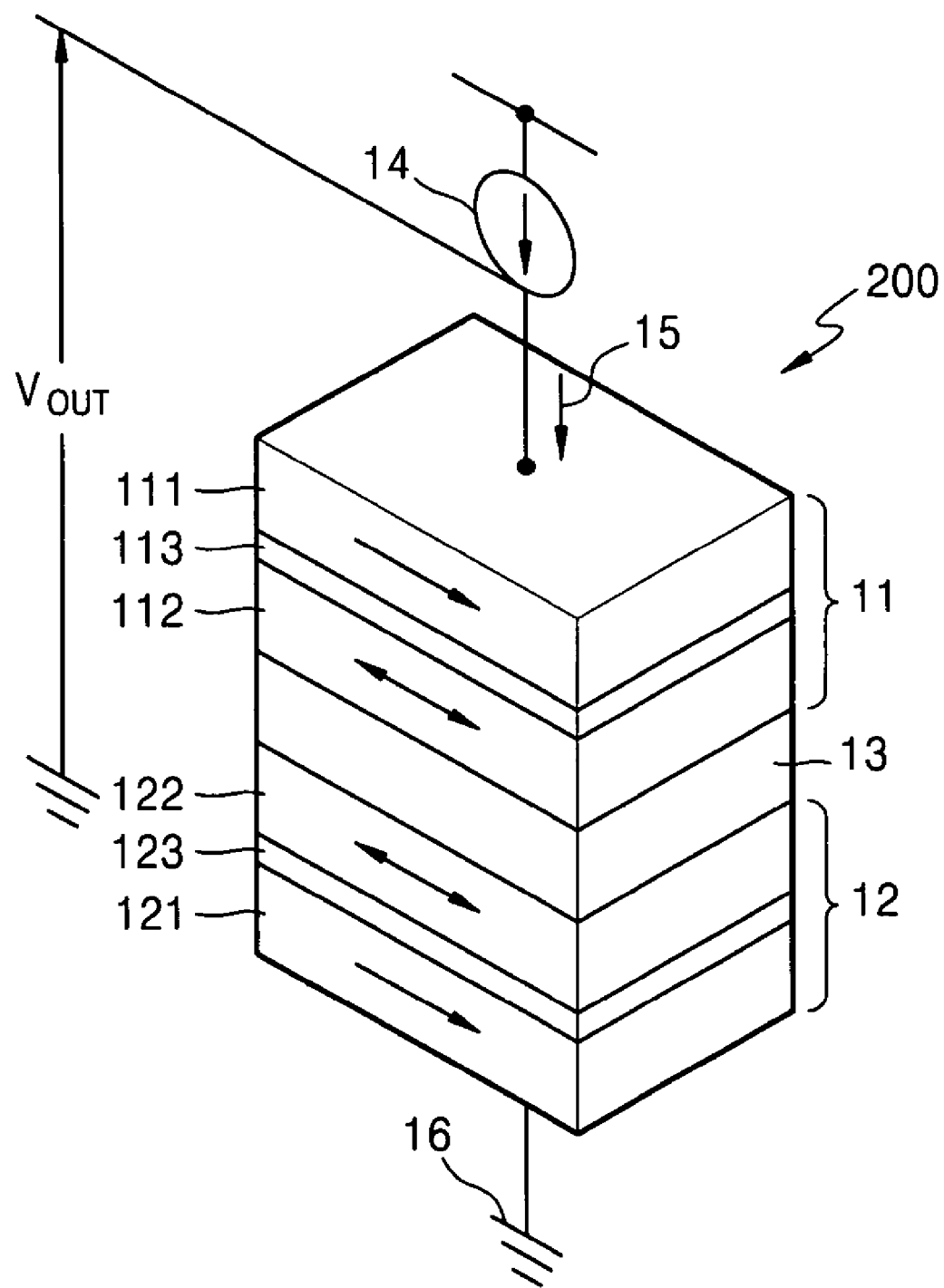
FIG. 2 is a schematic diagram of a conventional multi-bit magnetic RAM.
Figure 3A:
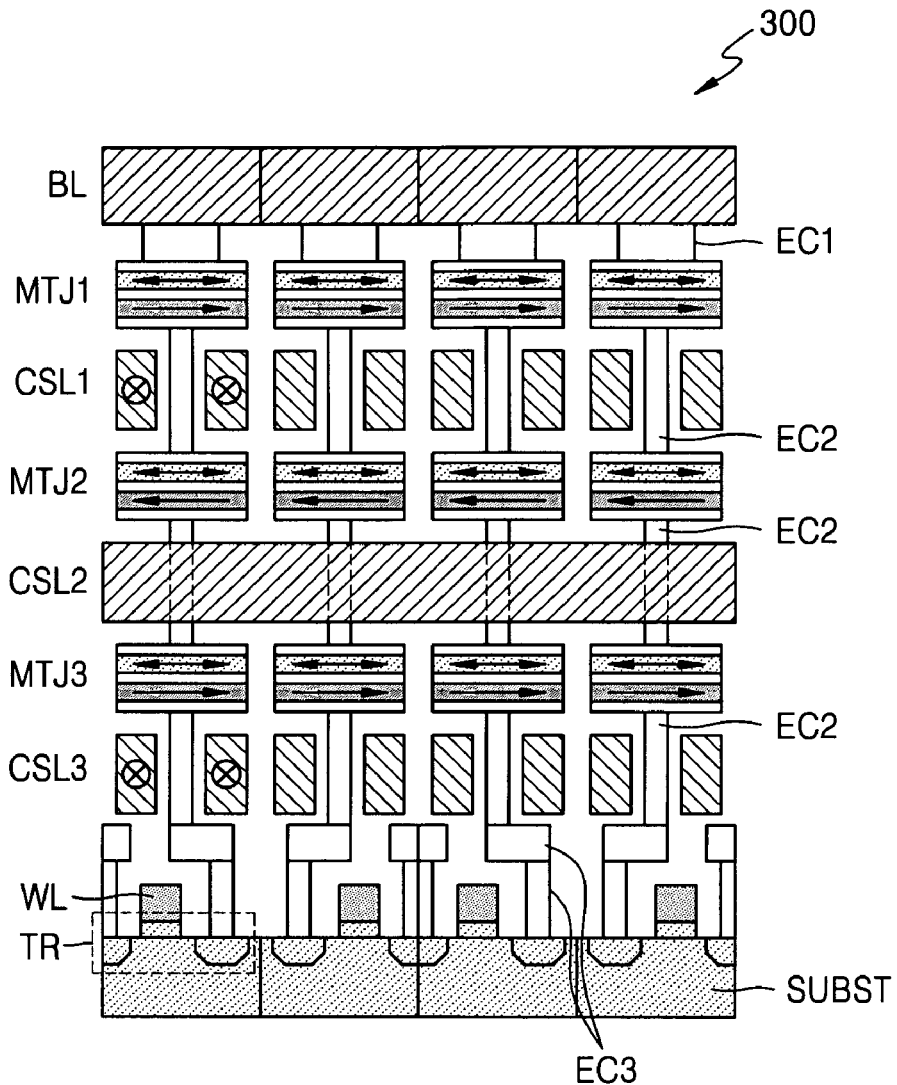
FIG. 3A is a schematic diagram of a magnetic RAM according to an embodiment of the present invention.

FIG. 3A is a schematic view of a magnetic RAM 300 according to an embodiment of the present invention.

Figure 3B:
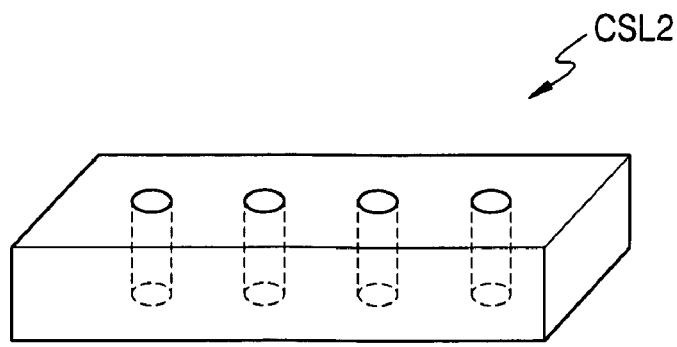
FIG. 3B is a perspective view of a second current supplying line of the magnetic RAM of FIG. 3A.

FIG. 3B is a perspective view of a second current supplying line CSL2 of the magnetic RAM 300 of FIG. 3A.

Referring to FIG. 3A, to generate a magnetic field during a data write operation, first through third current supplying lines CSL1, CSL2, and CSL3 are disposed, respectively, between a first resistance-variable element MTJ1 and a second resistance-variable element MTJ2, between the second resistance-variable element MTJ2 and a third resistance-variable element MTJ3, and between the third resistance-variable element MTJ3 and an access transistor TR. The first through third resistance-variable elements MTJ1, MTJ2, and MTJ3 are disposed between the access transistor TR and a bit line BL. The first through third resistance-variable elements MTJ1, MTJ2, and MTJ3 are electrically connected to each other by a conductive layer EC2. The bit line BL is connected to the first resistance-variable layer MTJ1 by a conductive layer EC1.

The conductive layer EC2 is connected to the access transistor TR via a conductive layer EC3. The first through third resistance-variable elements MTJ1, MTJ2, and MTJ3 are composed of a magneto-resistive material. The magneto-resistive material may be one of a MTJ (Magnetic Tunnel Junction) material, a GMR (Giant Magneto-Resistive) material, a spin valve, a ferromagnetic/metal/semiconductor hybrid structure, a III-V magnetic semiconductor composite structure, a metal/semiconductor composite structure, or a CMR.

The second current supplying line CSL2 is aligned parallel to the bit line BL. The first current supplying line CSL1 and the third current supplying line CSL3, which are parallel, are orthogonal to the bit line BL.

In the magnetic RAM 300 shown in FIG. 3A, to read data, a voltage applied to the bit line BL is measured or currents flowing through the first through third resistance-variable elements MTJ1, MTJ2, and MTJ3 are measured. Since data are written to the respective first through third resistance-variable elements MTJ1, MTJ2, and MTJ3 using the first through third current supplying lines CSL1, CSL2, and CSL3, it is possible to easily write multi-bit data. That is, current adjustment for controlling a magnetic field is not needed during a data write operation, and multiple write operations for writing data "01" and "10" are not needed.

The second resistance-variable element MTJ2 is connected to the third resistance-variable element MTJ3 by the second conductive layer EC2 passing through the second current supplying line CSL2. FIG. 3B shows the structure of the second current supplying line CSL2.

When a bi-directional current pulses through one of the first through third current supplying lines CSL1, CSL2, and CSL3, two of the first through third resistance-variable elements MTJ1, MTJ2, and MTJ3 have pinned ferromagnetic layers with opposite magnetization directions.

For example, when the first and second resistance-variable elements MTJ1 and MTJ2 share the first current supplying line CSL1, the magnetization directions of the pinned ferromagnetic layers of the first and second resistance-variable elements MTJ1 and MTJ2 are opposite to each other if a current flowing through the first current supplying line CSL1 is a bi-directional current.

Figures 4A, 4B:
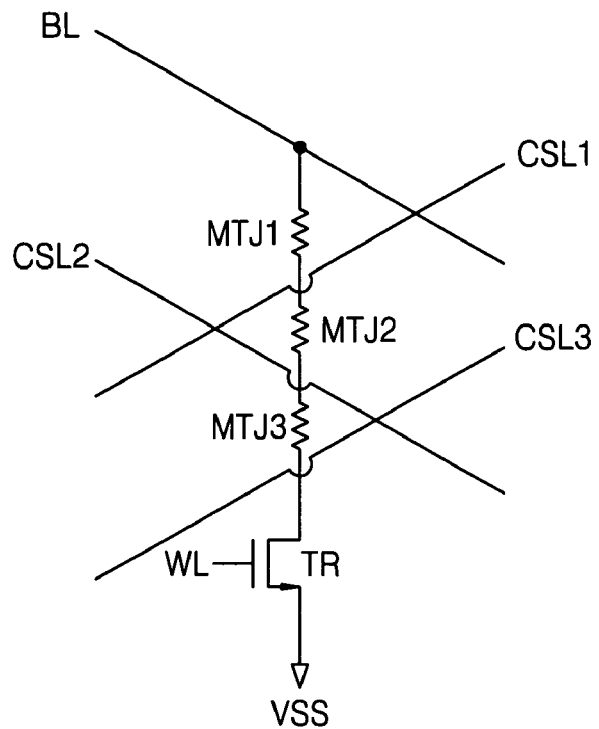
FIG. 4A is an equivalent circuit diagram of the magnetic RAM shown in FIG. 3A.
FIG. 4B is a table for explaining the states of data written to the magnetic RAM of FIG. 3A.

In this case, the same data is written to the first and second resistance-variable elements MTJ1 and MTJ2, in which the data can have four states: "00", "01", "10", and "11". FIG. 4A is an equivalent circuit diagram of the magnetic RAM 300 of FIG. 3A.

FIG. 4B is a table for explaining the states of data written to the magnetic RAM of FIG. 3A.

The first through third resistance-variable elements MTJ1, MTJ2, and MTJ3 have equal resistance characteristics. Each of the first through third resistance-variable elements MTJ1, MTJ2, and MTJ3 has a minimum resistance value of R and a maximum resistance of R+ΔR. It is assumed that, if "0" is written to the first through third resistance-variable elements MTJ1, MTJ2, and MTJ3, each of the first through third resistance-variable elements MTJ1, MTJ2, and MTJ3 has a resistance of R, and if "1" is written to the first through third resistance-variable elements MTJ1, MTJ2, and MTJ3, each of the first through third resistance-variable elements MTJ1, MTJ2, and MTJ3 has a resistance of R+ΔR.

Referring to FIG. 4B, if the data written to the first through third resistance-variable elements MTJ1, MTJ2, and MJT3 are all "0", that is, if the total resistance value of the first through third resistance-variable elements MTJ1, MTJ2, and MJT3 is "3R", it is determined that the magnetic RAM 300 stores data "00".

If one of the data written to the first through third resistance-variable elements MTJ1, MTJ2, and MTJ3 is "1" and the remaining data are "0", that is, if the total resistance of the first through third resistance-variable elements MTJ1, MTJ2, and MJT3 is "3R+ΔR", it is determined that the magnetic RAM 300 stores data "01".

If two of the data written to the first through third resistance-variable elements MTJ1, MTJ2, and MTJ3 are "1" and the remaining data is "0", that is, if the total resistance of the first through third resistance-variable elements MTJ1, MTJ2, and MJT3 is "3R+Δ2R", it is determined that the magnetic RAM 300 stores data "10".

If the data written to the first through third resistance-variable elements MTJ1, MTJ2, and MTJ3 are all "1", that is, if the total resistance value of the first through third resistance-variable elements MTJ1, MTJ2, and MJT3 is "3R+Δ3R", it is determined that the magnetic RAM 300 stores data "11". That is, the magnetic RAM 300 can store 2-bit data using the first through third resistance-variable elements MTJ1, MTJ2, and MTJ3 with the same resistance characteristics. The magnetic RAM 300 can have two structures according to the type of a current supplying line through which the bi-directional current flows.

FIG. 5 is a table for explaining data written to the magnetic RAM 300 of FIG. 3A. In the magnetic RAM 300, the longitudinal axes of the first through third resistance-variable elements MTJ1, MTJ2, and MTJ3 are aligned in parallel to the bit line BL and the second current supplying line CSL2. In this case, data are written to the first through third resistance-variable elements MTJ1, MTJ2, and MTJ3 in response to bi-directional currents flowing through the first and third current supplying lines CSL1 and CSL3.

Currents flowing through the bit line BL and the second current supplying line CSL2 are one-directional currents and currents flowing through the first and third current supplying lines CSL1 and CSL3 are bi-directional currents.

A magnetic field created by the direction of the current flowing through the first current supplying line CSL1 influences both the first and second resistance-variable elements MTJ1 and MTJ2.

In this case, by polarizing the pinned ferromagnetic layers of the first and second resistance-variable elements MTJ1 and MTJ2 in opposite directions, the same data can be written to the first and second resistance-variable elements MTJ1 and MTJ2 by the current flowing through the first current supplying line CSL1.

In the magnetic RAM 300 of FIG. 3A, the same data is written to two of the first through third resistance-variable elements MTJ1, MTJ2, and MTJ3, sharing one of the first or third current supplying lines CSL1 and CSL3 transmitting a bi-directional current.

The first resistance-variable element MTJ1 stores data in response to a current flowing the bit line BL in a predetermined direction and a current flowing through the first current supplying line CSL1 in one of two directions.

The second resistance-variable element MTJ2 stores data in response to a current through the second current supplying line CSL2 in a predetermined direction and a current flowing through the first current supplying line CSL1 in one of two directions.

The third resistance-variable element MTJ3 stores data in response to a current flowing through the second current supplying line CSL2 in a predetermined direction and a current flowing through the third current supplying line CSL3 in one of two directions. Referring to FIG. 5, the first and second resistance-variable elements MTJ1 and MTJ2 receive and store the same data from the first current supplying line CSL1, and the third resistance-variable element MTJ3 receives and stores data from the third current supplying line CSL3.

For example, referring to FIG. 3A, if a current flows through the third current supplying line CSL3 in a backward direction, since the direction of a magnetic field created by the third current supplying line CSL3 is the same as the magnetization direction of the pinned ferromagnetic layer of the third resistance-variable element MTJ3, the resistance value of the third resistance-variable elements MTJ3 decreases, thereby writing "0" in the third resistance-variable element MTJ3.

If a current flows through the third current supplying line CSL3 in a forward direction, since the direction of a magnetic field created by the third current supplying line CSL3 is opposite to the magnetization direction of the pinned ferromagnetic layer of the third resistance-variable element MTJ3, the resistance value of the third resistance-variable elements MTJ3 increases, thereby writing data "1" in the third resistance-variable element MTJ3. In this manner, the first through third resistance-variable elements MTJ1, MTJ2, and MTJ3 can store four states of data, that is, 2-bit data. When data is read, a predetermined current is applied to the first through third resistance-variable elements MTJ1, MTJ2, and MTJ3, thus generating a constant voltage across the bit line BL according to the total resistance of the first through third resistance-variable elements MTJ1, MTJ2, and MTJ3. Then, by measuring the generated voltage, 2-bit data written to the first through third resistance-variable elements MTJ1, MTJ2, and MTJ3 can be read.

Figure 6A:
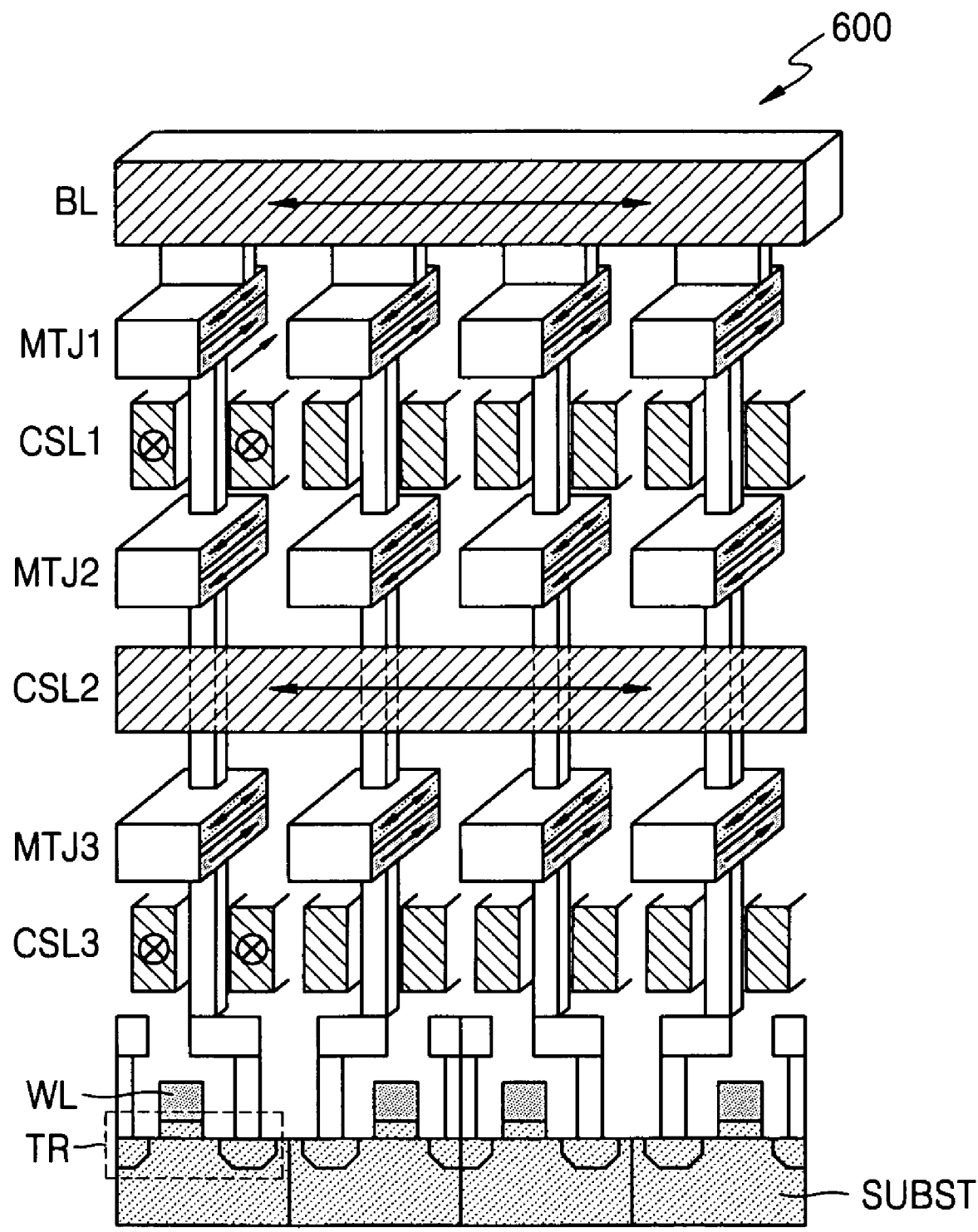
FIG. 6A is a schematic view of a magnetic RAM in which the longitudinal directions of first through third resistance-variable elements are different from those of the magnetic RAM shown in FIG. 3A.

FIG. 6A is a schematic view of a magnetic RAM 300 in which the longitudinal directions of the first through third resistance-variable elements MTJ1, MTJ2, and MTJ3 are different from those of the magnetic RAM 300 shown in FIG. 3A.

FIG. 6B is a table for explaining data written to the magnetic RAM 600 shown FIG. 6A.

Referring to FIG. 6A, in the magnetic RAM 600, the longitudinal directions of first through third resistance-variable elements MTJ1, MTJ2, and MTJ3 are aligned perpendicular to a bit line BL and a second current supplying line CSL2. In the magnetic RAM 600, data is written by a current flowing in a direction perpendicular to the longitudinal directions of the first through third resistance-variable elements MTJ1, MTJ2, and MTJ3. That is, referring to FIG. 6A, data are written to the first through third resistance-variable elements MTJ1, MTJ2, and MTJ3 in response to bi-directional currents flowing through the bit line BL and the second current supplying line CSL2.

Currents flowing through the first and third current supplying lines CSL1 and CSL3 travel in a predetermined direction and currents flowing through the bit line BL and the second current supplying line CSL2 can travel in one of two directions. The second and third resistance-variable elements MTJ2 and MTJ3 share the second current supplying line CSL2. Accordingly, by polarizing the pinned ferromagnetic layers of the second and third resistance-variable elements MTJ2 and MTJ3 in opposite directions, the same data can be written to the second and third resistance-variable elements MTJ2 and MTJ3.

As shown in FIG. 6B, data are written to the first through third resistance-variable elements MTJ1, MTJ2, and MTJ3 according to the directions of currents flowing through the bit line BL and the second current supplying line CSL2. For example, if a current flows in the left direction through the bit line BL, since the direction of the generated magnetic field is opposite to the magnetization direction of the pinned ferromagnetic layer of the first resistance-variable element MTJ1, the resistance of the first resistance-variable element MTJ1 increases, thereby writing "1" in the first resistance-variable element MTJ1.

If a current flows in the right direction through the bit line BL, since the direction of the generated magnetic field is the same as the magnetization direction of the pinned ferromagnetic layer of the first resistance-variable element MTJ1, the resistance of the first resistance-variable element MTJ1 decreases, thereby writing "0" in the first resistance-variable element MTJ1. In this manner, the first through third resistance-variable elements MTJ1, MTJ2, and MTJ3 can store four states of data, that is, 2-bit data.

Each of the magnetic RAMs 300 and 600 shown in FIGS. 3A and 6A has a structure in which three resistance-variable elements MTJ1, MTJ2, and MTJ3 are alternately stacked with the first through third current supplying lines CSL1, CSL2, and CSL3. However, it will be understood by those of ordinary skill in the art that the present invention is not limited to the three resistance-variable elements MTJ1, MTJ2, and MTJ3.

A magnetic RAM according to an embodiment of the present invention includes an access transistor formed on a substrate, first through $(2^n-1)$-th resistance-variable elements stacked between a bit line and the access transistor and electrically connected to each other, and first through $(2^n-1)$-th current supplying lines alternately stacked with the first through $(2^n-1)$-th resistance-variable elements.

In a magnetic RAM performing multi-bit (for example, n-bit) operations with a similar structure to the magnetic RAM 300 shown in FIG. 3A, $2^n-1$ resistance-variable elements are provided.

Figure 7:
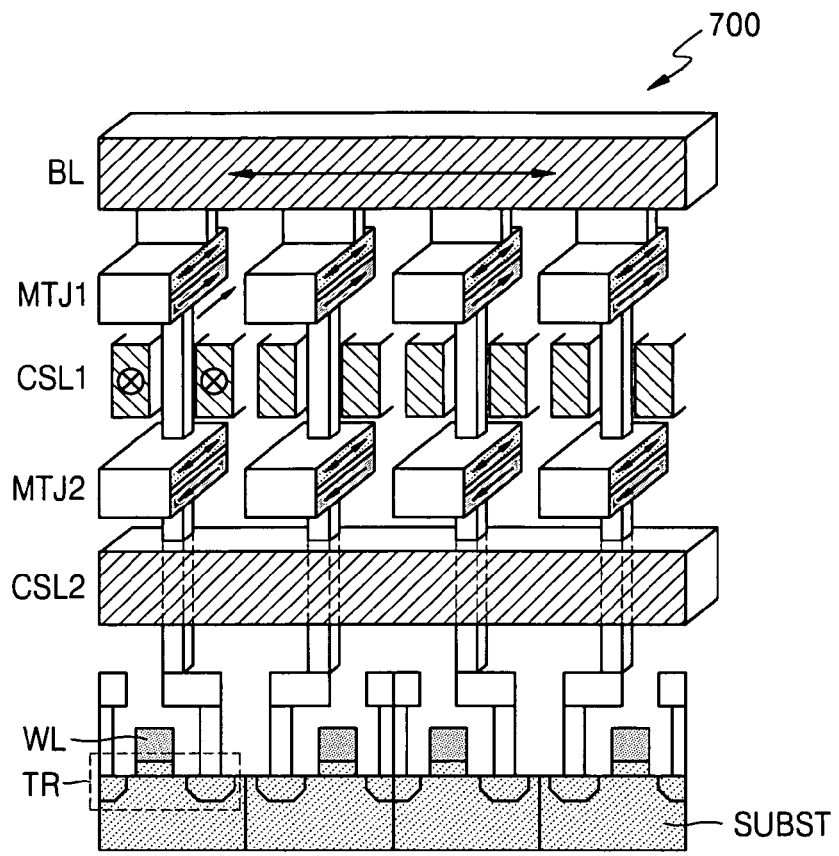
FIG. 7 is a schematic view of a magnetic RAM according to an embodiment of the present invention.

A magnetic RAM according to an embodiment of the present invention can include additional resistance-variable elements and current supplying lines as compared with the multi-bit structures as shown in the magnetic RAMs 300 and 600 of FIGS. 3A and 6A. Detailed descriptions thereof are omitted. FIG. 7 is a schematic view of a magnetic RAM 700 according to an embodiment of the present invention.

Referring to FIG. 7, the magnetic RAM 700 includes an access transistor TR formed on a substrate SUBST, first and second resistance-variable elements MTJ1 and MTJ2, and first and second current supplying lines CSL1 and CSL2. The first and second resistance-variable elements MTJ1 and MTJ2 are disposed between a bit line BL and an access transistor TR. The first and second resistance-variable elements MTJ1 and MTJ2 are electrically connected to each other. The first current supplying line CSL1 is disposed between the first resistance-variable element MTJ1 and the second resistance-variable element MTJ2. The second current supplying line CSL2 is disposed between the second resistance-variable element MTJ2 and the access transistor TR.

The magnetic RAM 700 has a substantially similar structure as the magnetic RAMs 300 and 600 of FIGS. 3A and 6A, and includes two resistance-variable elements MTJ1 and MTJ2 and two current supplying lines CSL1 and CSL2. The magnetic RAM 700 accordingly operates in the same manner as the magnetic RAMs 300 and 600.

In the magnetic RAM 700, a predetermined conductive layer passes through the first and second current supplying lines CSL1 and CSL2. The second resistance-variable element MTJ2 is connected to the drain of the access transistor TR via a conductive layer passing through the second current supplying line CSL2. The bit line BL and the second current supplying line CSL2 are orthogonal to the first current supplying line CSL1.

Also, the longitudinal axis of the first and second resistance-variable elements MTJ1 and MTJ2 is aligned perpendicular to the bit line BL and the second current supplying line CSL2, so that data can be written to the first and second resistance-variable elements MTJ1 and MTJ2 in response to bi-directional currents flowing through the bit line BL and the second current supplying line CSL2.

To store 2-bit data in the magnetic RAM 700 of FIG. 7 using the two resistance-variable elements MTJ1 and MTJ2, the first and second resistance-variable elements MTJ1 and MTJ2 need to have different resistance characteristics. The different resistance characteristics correspond to the thicknesses of the tunnel barrier layers of the two resistance-variable elements MTJ1 and MTJ2 are different.

For example, if the resistance of one of the resistance-variable elements MJ1 and MTJ2 is doubled, the resistance-variable element with the doubled resistance can act as two resistance-variable elements in which the same data is simultaneously written as shown in the magnetic RAMs 300 and 600 of FIGS. 3A and 6A.

In the magnetic RAM 700 of FIG. 7, a current can flow in either direction through the bit line BL and the second current supplying line CSL2. Further, a current flows in a predetermined direction through the first current supplying line CSL1.

Accordingly, since data can be individually written to each of the first and second resistance-variable elements MTJ1 and MTJ2, the resistance-variable elements MTJ1 and MTJ2 need not have different hysteresis characteristics to adjust the current for controlling a magnetic field during data writing and to perform multiple write operations when "10" or "10" is written, thus simplifying a data write operation.

Figure 8A:
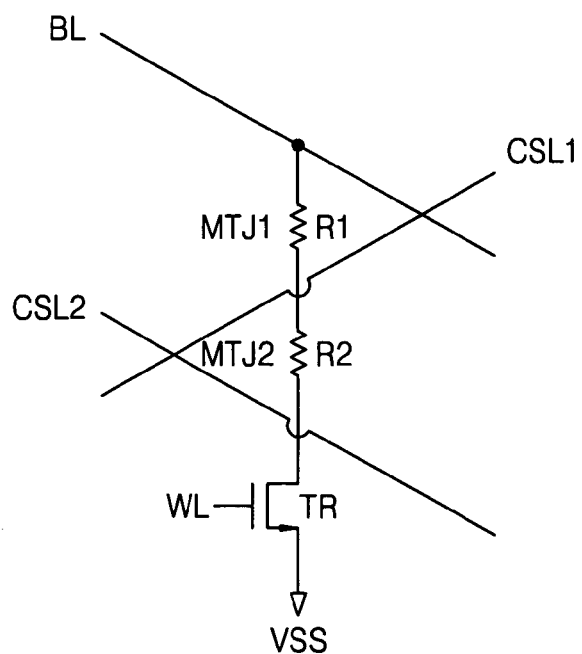
FIG. 8A is an equivalent circuit diagram of the magnetic RAM shown in FIG. 7.

FIG. 8A is an equivalent circuit diagram of the magnetic RAM 700 of FIG. 7.

FIG. 8B is a table for explaining the states of data written to the magnetic RAM 700 of FIG. 7.

Referring to FIGS. 8A and 8B, in the magnetic RAM 700, the resistance-variable elements MTJ1 and MTJ2 have different resistances. If the resistance of the first resistance-variable element MTJ1 has a minimum value R1 and a maximum value of R1+ΔR1, and the resistance value of the second resistance-variable element MTJ2 has a minimum value of R2 and a maximum value of R2+ΔR2, the magnetic RAM 700 has four possible resistances according to data written to the first and second resistance-variable elements MTJ1 and MTJ2.

The magnetic RAM 700 has a resistance of R1+R2 when all the two resistance-variable elements MTJ1 and MTJ2 store "0", has a resistance of R1+R2+ΔR1 when only the first resistance-variable element MTJ1 stores "1", has a resistance of R1+R2+ΔR2 when only the second resistance-variable element MTJ2 stores data "1", and has a resistance of R1+R2+ΔR1 +ΔR2 when all the two resistance-variable elements MTJ1 and MTJ2 store "1".

When data written to the magnetic RAM 700 is read, a constant current is applied to generate a voltage corresponding to the resistance and the generated voltage is detected through a bit line BL.

FIG. 9 is a table for explaining data written to the magnetic RAM 700 of FIG. 7.

Referring to FIGS. 7 and 9, if currents flow in the right direction through the bit line BL and the second current supplying line CSL2, since the direction of a generated magnetic field is equal to the magnetization direction of the pinned ferromagnetic layers of the first and second resistance-variable elements MTJ1 and MTJ2, the total resistance of the first and second resistance-variable elements MTJ1 and MTJ2 decreases, thereby writing data "0" in the first and second resistance-variable elements MTJ1 and MTJ2.

If a current flows in the left direction through the bit line BL and the second current supplying line CSL2, since the direction of a generated magnetic field is opposite to the magnetization direction of the pinned ferromagnetic layers of the first and second resistance-variable elements MTJ1 and MTJ2, the total resistance of the first and second resistance-variable elements MTJ1 and MTJ2 increases, thereby writing data "1" in the first and second resistance-variable elements MTJ1 and MTJ2.

In this manner, the magnetic RAM 700 can store 2-bit data using the two resistance-variable elements MTJ1 and MTJ2.

Figures 10A, 10B:
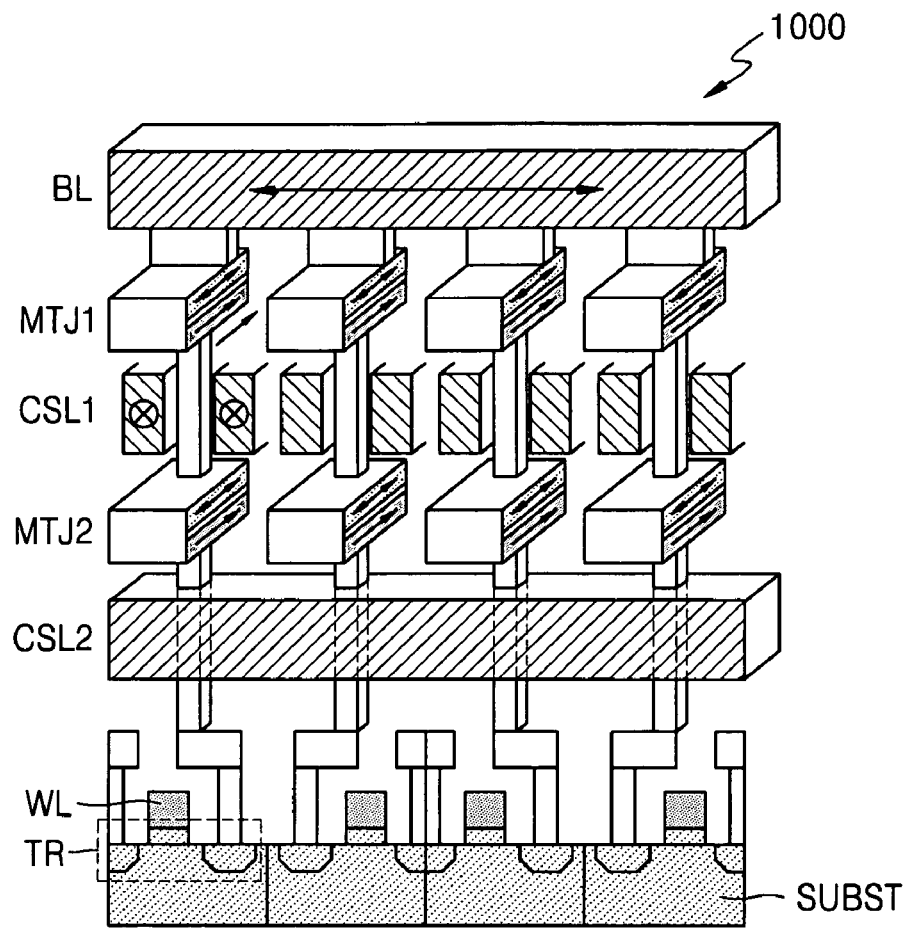
FIG. 10A is a schematic view of a magnetic RAM in which the magnetization directions of the pinned ferromagnetic layers of first and second resistance-variable elements are different from those shown in FIG. 7.
FIG. 10B is a table for explaining data written to a magnetic RAM of FIG. 10A.

FIG. 10A is a schematic view of a magnetic RAM 1000 in which the magnetization directions of pinned ferromagnetic layers of first and second resistance-variable elements MTJ1 and MTJ2 are different from those shown in FIG. 7.

FIG. 10B is a table for explaining data written to the magnetic RAM 1000 of FIG. 10A.

In the magnetic RAM 700 of FIG. 7, the magnetization directions of the pinned ferromagnetic layers of the first and second resistance-variable elements MTJ1 and MTJ2 are opposite to each other. However, in the magnetic RAM 1000 of FIG. 10A, the magnetization directions of the pinned ferromagnetic layers of the first and second resistance-variable element MTJ1 and MTJ2 are the same.

Accordingly, data shown in FIG. 10B are written to the first and second resistance-variable elements MTJ1 and MTJ2 by currents flowing through a bit line BL and a second current supplying line CSL2.

If currents flow in the right direction through the bit line BL and the second current supplying line CSL2, since the direction of a generated magnetic field is the same as the magnetization direction of the pinned ferromagnetic layer of the first resistance-variable element MTJ1, the resistance of the first resistance-variable element MTJ1 decreases. Also, since the direction of the generated magnetic field is opposite to the magnetization direction of the pinned ferromagnetic layer of the second resistance-variable element MTJ2, the resistance of the second resistance-variable element MTJ2 increases. Therefore, "0" is written to the first resistance-variable element MTJ1 and "1" is written to the second resistance-variable element MTJ2.

If currents flow in the left direction through the bit line BL and the second current supplying line CSL2, since the direction of a generated magnetic field is opposite to the magnetization direction of the pinned ferromagnetic layer of the first resistance-variable element MTJ1, the resistance of the first resistance-variable element MTJ1 increases. Also, since the direction of the generated magnetic field is the same as the magnetization direction of the pinned ferromagnetic layer of the second resistance-variable element MTJ2, the resistance of the second resistance-variable element MTJ2 decreases. Therefore, "1" is written to the first resistance-variable element MTJ1 and "0" is written to the second resistance-variable element MTJ2.

If the direction of a current flowing through the bit line BL and the direction of a current flowing through the second current supplying line CSL2 are opposite to each other, the same data can be written to the first and second resistance-variable elements MTJ1 and MTJ2.

For the magnetic RAM 700 shown in FIG. 7 to perform multi-bit (for example, n-bit) operations, $2^n-1$ resistance-variable elements are provided.

A magnetic RAM according to an embodiment of the present invention includes an access transistor formed on a substrate, bit lines and digit lines alternately stacked on the access transistor, and a plurality of resistance-variable elements disposed between the bit lines and the digit lines, wherein the resistance-variable elements are electrically connected to each other.

The bit lines include the bit lines BL and the second current supplying line CSL2 of the magnetic RAM 300 and 700 of FIGS. 3A and 7, respectively, and the digit lines include the first and third current supplying lines CSL1 and CSL3 in the magnetic RAMs 300 and 700 of FIGS. 3A and 7, respectively.

Accordingly, the magnetic RAM according to an embodiment of the present invention can have a similar structure to the magnetic RAMs 300 and 700 of FIGS. 3 and 7, and therefore, a detailed description thereof is omitted.

While the present invention has been particularly shown and described with reference to exemplary embodiments thereof, it will be understood by those of ordinary skill in the art that various changes in form and details may be made therein without departing from the spirit and scope of the present invention.

What is claimed is:

1. A magnetic random access memory (RAM) comprising:
   an access transistor formed on a substrate;
   first through third resistance-variable elements sequentially stacked between a bit line and the access transistor, wherein the first through third resistance-variable elements electrically are connected to each other; and
   first through third current supplying lines disposed alternately with the first through third resistance-variable elements, respectively, beginning with the first resistance-variable element disposed adjacent to the bit line, wherein a predetermined conductive layer passes through the first through third current supplying lines.

2. The magnetic RAM of claim 1, wherein the first through third resistance-variable elements have equal resistance characteristics.

3. The magnetic RAM of claim 1, wherein each of the first through third resistance-variable elements includes a pinned ferromagnetic layer, wherein two of the first through third resistance-variable elements share one of the first through third current supplying lines, through which a bi-directional current flows, wherein polarized directions of the pinned ferromagnetic layers of the two of the first through third resistance-variable elements are opposite to each other.

4. The magnetic RAM of claim 1, wherein the same data is written to two of the first through third resistance-variable elements sharing one of the first through third current supplying lines, through which a bi-directional current flows.

5. The magnetic RAM of claim 1, wherein the bit line and the second current supplying line are orthogonal to the first and third current supplying lines.

6. The magnetic RAM of claim 1, wherein longitudinal axes of the first through third resistance-variable elements are aligned in parallel with the bit line and the second current supplying line, and data are written to the first through third resistance-variable elements in response to bi-directional currents flowing through the first through third current supplying lines.

7. The magnetic RAM of claim 1, wherein longitudinal axes of the first through third resistance-variable elements are perpendicular to the bit line and the second current supplying line, and data are written to the first through third resistance-variable elements in response to bi-directional currents flowing through the bit line and the second current supplying line.

8. The magnetic RAM of claim 1, wherein the first and third resistance-variable elements are comprised of a magneto-resistive material.

9. A magnetic random access memory (RAM) comprising:
   an access transistor formed on a substrate;
   first and second resistance-variable elements formed on the access transistor, the first and second resistance-variable elements being electrically connected to each other;
   a bit line formed on the first resistance-variable element; and
   a plurality of current supplying lines respectively disposed alternately with the first and second resistance-variable elements, respectively, beginning with the first resistance-variable element disposed adjacent to the bit line, wherein a predetermined conductive layer passes through the plurality of current supplying lines.

10. The magnetic RAM of claim 9, wherein the first and second resistance-variable elements have different resistance characteristics.

11. The magnetic RAM of claim 9, wherein the resistance value of the second resistance-variable element is twice the resistance of the first resistance-variable element.

12. The magnetic RAM of claim 9, wherein the bit line and the second current supplying line are orthogonal to the first current supplying line.

13. The magnetic RAM of claim 9, wherein longitudinal axes of the first and second resistance-variable elements are aligned perpendicular to the bit line and the second current supplying line, and
   data are written to the first and second resistance-variable elements in response to bi-directional currents flowing through the bit line and the second current supplying line.

14. The magnetic RAM of claim 9, wherein the first and second resistance-variable elements are comprised of a magneto-resistive material.

15. A magnetic random access memory (RAM) capable of simultaneously writing or reading n-bit data, comprising:
   an access transistor formed on a substrate;
   first through $(2^n-1)$-th resistance-variable elements formed on the access transistor, the first through $(2^n-1)$-th resistance-variable elements being electrically connected to each other;
   a bit line formed on the first resistance variable element; and first through ($2^n-1$)-th current supplying lines stacked alternately with the first through ($2^n-1$)-th resistance-variable elements, wherein a predetermined conductive layer passes through the first through ($2^n-1$)-th current supplying lines.

16. The magnetic RAM of claim 15, wherein the first through ($2^n-1$)-th resistance-variable elements have equal resistance characteristics.

17. The magnetic RAM of claim 15, wherein magnetization directions of pinned ferromagnetic layers of two of the first through ($2^n-1$)-th resistance-variable elements, sharing one of the first through ($2^n-1$)-th current supplying lines, through which a bi-directional current flows, are opposite to each other.

18. The magnetic RAM of claim 15, wherein the bit line is orthogonal to an adjacent current supplying line, wherein a direction of each successive current supply line is orthogonal to a previous current supply line.

19. The magnetic RAM of claim 15, wherein longitudinal axes of the first through ($2^n-1$)-th resistance-variable elements are arranged in parallel with the bit line, and data are written to the first through ($2^n-1$)-th resistance-variable elements in response to bi-directional currents flowing through the odd-numbered current supplying lines.

20. The magnetic RAM of claim 15, wherein longitudinal axes of the first through ($2^n-1$)-th resistance-variable elements are arranged perpendicular to the bit line, and data are written to the first through ($2^n-1$)-th resistance-variable elements in response to bi-directional currents flowing through the bit line and the even-numbered current supplying lines.

21. The magnetic RAM of claim 15, wherein the first through ($2^n-1$)-th resistance-variable elements are comprised of a magneto-resistive material.

22. A magnetic random access memory (RAM) comprising:

an access transistor formed on a substrate;

first through third resistance-variable elements sequentially stacked between a bit line and the access transistor, wherein the first through third resistance-variable elements electrically are connected to each other; and first through third current supplying lines disposed alternately with the first through third resistance-variable elements, respectively, beginning with the first resistance-variable element disposed adjacent to the bit line, wherein the bit line and the second current supplying line are orthogonal to the first and third current supplying lines.

23. A magnetic random access memory (RAM) comprising:

an access transistor formed on a substrate;

first and second resistance-variable elements formed on the access transistor, the first and second resistance-variable elements being electrically connected to each other;

a bit line formed on the first resistance-variable element; and a plurality of current supplying lines respectively disposed alternately with the first and second resistance-variable elements, respectively, beginning with the first resistance-variable element disposed adjacent to the bit line, wherein the bit line and the second current supplying line are orthogonal to the first current supplying line.

24. A magnetic random access memory (RAM) capable of simultaneously writing or reading n-bit data, comprising:

an access transistor formed on a substrate;

first through ($2^n-1$)-th resistance-variable elements formed on the access transistor, the first through ($2^n-1$)-th resistance-variable elements being electrically connected to each other;

a bit line formed on the first resistance variable element; and first through ($2^n-1$)-th current supplying lines stacked alternately with the first through ($2^n-1$)-th resistance-variable elements, wherein n is a positive integer, and wherein the bit line is orthogonal to an adjacent current supplying line, wherein a direction of each successive current supply line is orthogonal to a previous current supply line.

* * * * *